(12) United States Patent
Chiba

(10) Patent No.: US 9,244,507 B2
(45) Date of Patent: Jan. 26, 2016

(54) ELECTRONIC DEVICE

(71) Applicant: Yasunori Chiba, Tachikawa (JP)

(72) Inventor: Yasunori Chiba, Tachikawa (JP)

(73) Assignee: Casio Computer Co., Ltd, Tokyo (JP)

( * ) Notice: Subject to any disclaimer, the term of this patent is extended or adjusted under 35 U.S.C. 154(b) by 10 days.

(21) Appl. No.: 13/746,539

(22) Filed: Jan. 22, 2013

(65) Prior Publication Data

US 2013/0194732 A1  Aug. 1, 2013

(30) Foreign Application Priority Data

Jan. 26, 2012 (JP) .................................. 2012-013764

(51) Int. Cl.
| | | |
|---|---|---|
| *G06F 1/16* | (2006.01) | |
| *H01M 2/10* | (2006.01) | |
| *G06F 1/26* | (2006.01) | |
| *H01R 13/00* | (2006.01) | |
| *H05K 7/02* | (2006.01) | |

(Continued)

(52) U.S. Cl.
CPC .................. *G06F 1/26* (2013.01); *G06F 1/188* (2013.01); *H01M 2/1022* (2013.01); *H01M 2/1055* (2013.01); *H01M 2/1066* (2013.01); *H01R 13/00* (2013.01); *H05K 5/0086* (2013.01); *H05K 7/02* (2013.01)

(58) Field of Classification Search
CPC ......... G06F 1/26; G06F 1/188; H01M 2/1022
USPC ............. 361/679.01–679.45, 679.55–679.59; 429/97, 100
See application file for complete search history.

(56) References Cited

U.S. PATENT DOCUMENTS

| | | | |
|---|---|---|---|
| 5,931,513 A | * | 8/1999 | Conti ..................... E05C 19/066 220/324 |
| 7,465,516 B2 | | 12/2008 | Nagura |
| 2006/0097694 A1 | * | 5/2006 | Nagura ............... H01M 2/1022 320/112 |

(Continued)

FOREIGN PATENT DOCUMENTS

| | | | |
|---|---|---|---|
| JP | 64-018571 | | 1/1989 |
| JP | 6418571 U | * | 1/1989 |

(Continued)

OTHER PUBLICATIONS

European Search Report mailed Jun. 3, 2013 for European Application No. 13152515.6.

(Continued)

*Primary Examiner* — Nidhi Thaker
(74) *Attorney, Agent, or Firm* — Amin, Turocy & Watson, LLP

(57) ABSTRACT

An electronic device of the present invention has a battery storage structure with a battery pack inserted into a battery storage section provided in a device case, a battery electrode provided on a side surface of the battery pack that comes in contact with a connection electrode provided within the battery storage section and the battery storage section is openably/closably covered by a battery cover. This electronic device includes a locking member which engageably locks the battery pack into the battery storage section by sliding the battery pack into place, and a guide pressing section provided on the battery cover which presses the battery pack towards the connection electrode once inserted between inner surface parts positioned on opposite sides of the connection electrode of the battery storage section and the battery pack opposing side with the battery cover covering the battery storage section where the battery pack is stored.

5 Claims, 10 Drawing Sheets

(51) Int. Cl.
*G06F 1/18* (2006.01)
*H05K 5/00* (2006.01)

(56) References Cited

U.S. PATENT DOCUMENTS

| | | | | |
|---|---|---|---|---|
| 2007/0122693 A1* | 5/2007 | Qin | ................. | H01M 2/1066 429/97 |
| 2010/0035138 A1* | 2/2010 | Itoda | ................. | G03B 17/00 429/100 |
| 2013/0194732 A1 | 8/2013 | Chiba | | |

FOREIGN PATENT DOCUMENTS

| JP | 64018571 U | * | 1/1989 |
|---|---|---|---|
| JP | 2000-340960 | | 12/2000 |
| JP | 2001-243932 | | 9/2001 |
| JP | 2004-022341 | | 1/2004 |
| JP | 2004-319148 | | 11/2004 |
| JP | 2004319148 A | * | 11/2004 |
| JP | 2008-027926 | | 2/2008 |
| JP | 2009-032431 | | 2/2009 |
| JP | 2009032431 A | * | 2/2009 |
| JP | 2010-205516 | | 9/2010 |
| JP | 2013-152892 | | 8/2013 |

OTHER PUBLICATIONS

Office Action of Notification of Reasons for Rejection for Japanese Patent Application No. 2012-013764 Dated Jan. 15, 2014, 4 pgs.
Office Action of Notification of Reason(s) for Rejection for Japanese Patent Application No. 2014-172119 dated Sep. 29, 2015, 11 pages.

* cited by examiner

ELECTRONIC DEVICE

CROSS-REFERENCE TO RELATED APPLICATION

This application is based upon and claims the benefit of priority from the prior Japanese Patent Application No. 2012-013764, filed Jan. 26, 2012, the entire contents of which is incorporated herein by reference.

BACKGROUND OF THE INVENTION

1. Field of the Invention

The present invention relates to an electronic device, such as a mobile information terminal, a mobile phone and a mobile personal computer.

2. Description of the Related Art

A mobile compact electronic device is known that has a battery storage structure in which a battery pack is removably stored in a battery storage section provided in a device case, as described in Japanese Patent Application Laid-Open (Kokai) Publication No. 2000-340960.

In this type of battery storage structure, a connection electrode resiliently projects from one side surface within the battery storage section by the spring force of a spring member. When the battery pack is stored in the battery storage section, the connection electrode is inserted into an electrode hole provided on a side surface of the battery pack and resiliently comes in contact with a battery electrode of the battery pack. As a result, the connection electrode of the battery storage section and the battery electrode of the battery pack are electrically connected.

In this instance, the connection electrode within the battery storage section has a circular conical shape with a pointed tip. When the battery pack is inserted into the battery storage section, the tip portion of the circular conical shape is pressed by the side surface of the battery pack and moves in a direction in which the tip portion is pressed outward from the interior of the battery storage section. Then, when the tip portion corresponds to the electrode hole of the battery pack, the pointed tip portion of the connection electrode is inserted into the electrode hole and resiliently comes in contact with the battery electrode.

However, in this battery storage structure where the connection electrode within the battery storage section resiliently comes in contact with and is connected to the battery electrode of the battery pack, there is a problem in that, when the spring force of the spring member which resiliently and outwardly presses the connection electrode within the battery storage section is strong, the insertion of the battery pack into the battery storage section is difficult and the side surface of the battery pack is easily scratched. In addition, when the spring force of the spring member is weak, the contact between the connection electrode within the battery storage section and the battery electrode of the battery pack is unstable, and as a result the connection therebetween is unreliable.

SUMMARY OF THE INVENTION

An object of the present invention is to enable a battery pack to be securely and favorably stored, and a battery electrode of a battery pack and a connection electrode of a battery storage section to be unfailingly and favorably connected.

In order to achieve the above-described object, in accordance with one aspect of the present invention, there is provided an electronic device having a battery storage structure with a battery pack inserted into a battery storage section provided in a device case, a battery electrode provided on a side surface of the battery pack that comes in contact with a connection electrode provided within the battery storage section and the battery storage section is openably/closably covered by a battery cover, comprising: a locking member which engageably locks the battery pack into the battery storage section by sliding the battery pack while being inserted into the battery storage section with the battery electrode of the battery pack facing the connection electrode within the battery storage section; and a guide pressing section provided on the battery cover which presses the battery pack towards the connection electrode once inserted between inner surface parts positioned on opposite sides of the connection electrode of the battery storage section and the battery pack opposing side with the battery cover covering the battery storage section where the battery pack is stored.

In the present invention, a battery pack can be securely and favorably stored. In addition, a battery electrode of a battery pack and a connection electrode of a battery storage section can be unfailingly and favorably connected.

The above and further objects and novel features of the present invention will more fully appear from the following detailed description when the same is read in conjunction with the accompanying drawings. It is to be expressly understood, however, that the drawings are for the purpose of illustration only and are not intended as a definition of the limits of the invention.

BRIEF DESCRIPTION OF THE DRAWINGS

FIG. 10A and FIG. 10B are diagrams showing the battery cover of the mobile information terminal shown in FIG. 3, of which FIG. 10A is an enlarged rear view thereof and FIG. 10B is an enlarged side view thereof.

DETAILED DESCRIPTION OF THE PREFERRED EMBODIMENTS

An embodiment in which the present invention has been applied to a mobile information terminal will hereinafter be described with reference to FIG. 1 to FIG. 10. This mobile information terminal includes a device case 1 as shown in FIG. 1 and FIG. 2, and the device case 1 includes an upper case 2, a lower case 3, and an inner case 4, as shown in FIG. 1 to FIG. 3 and FIG. 6.

Figure 1:
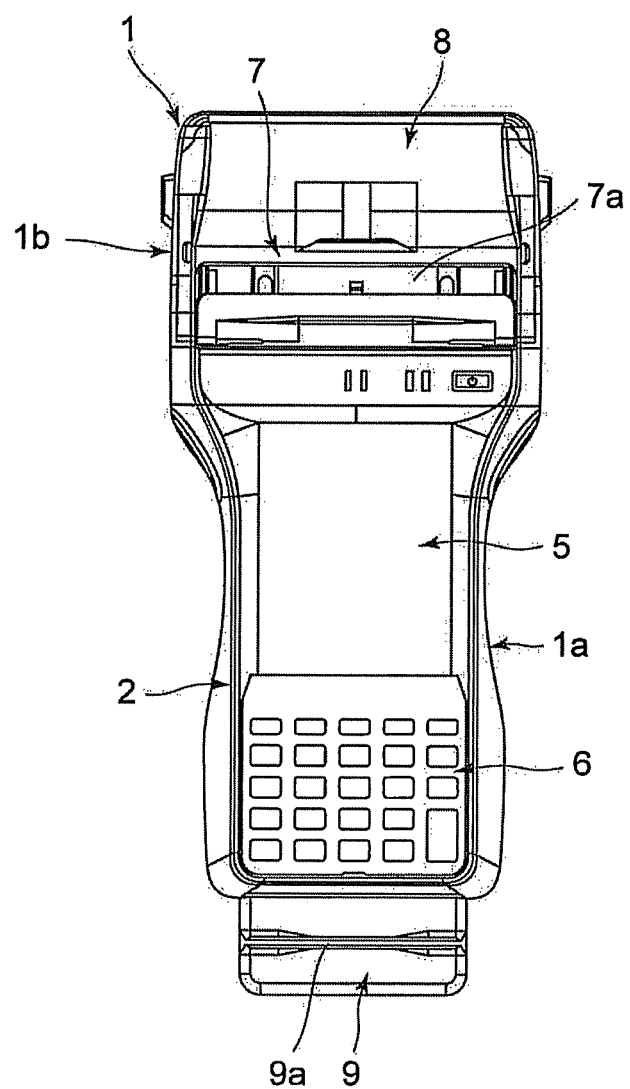
FIG. 1 is a front view of an embodiment in which the present invention has been applied to a mobile information terminal.
Figure 2:
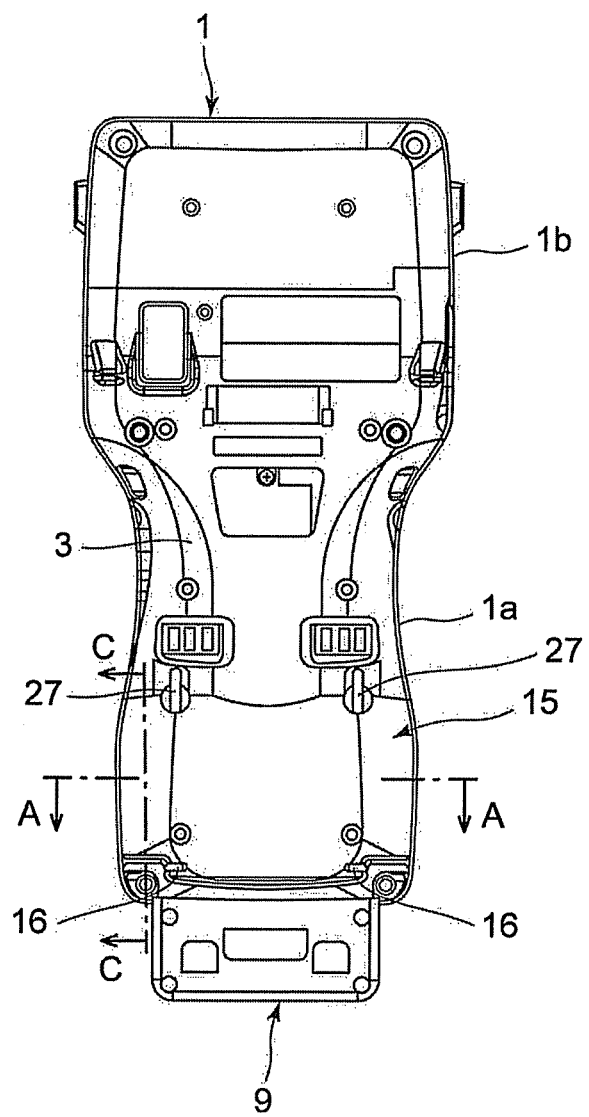
FIG. 2 is a rear view of the mobile information terminal shown in FIG. 1.

This device case 1 has a substantially rectangular box shape that is, as a whole, elongated in a vertical direction (up/down direction in FIG. 1), as shown in FIG. 1 and FIG. 2. In this instance, the near side of the device case 1 (lower side in FIG. 1) is formed into a grip section 1a having a narrow width, and the tip side (upper side in FIG. 1) is formed into a printer mounting section 1b having a wide width. In the grip section 1a of the upper case 2 of the device case 1, an input display section 5 and a key input section 6 are provided.

The input display section 5 is structured by a transparent touch panel being arranged on the front surface of a display panel. Information displayed on the display panel can be viewed through the transparent touch panel and the user inputs information by touch-operating the touch panel while viewing the displayed information. The key input section 6 includes various keys, such as a numeric keypad and a function key, by which information is inputted.

In the printer mounting section 1b in the upper case 2 of the device case 1, a printer section 7 and a printer cover 8 are provided as shown in FIG. 1. The printer cover 8, which is freely openable and closable, covers a recording paper storage section (not shown) and is rotatably attached to the edge of the upper side portion of the recording paper storage section. The recording paper storage section rotatably stores recording paper in the form of a roll.

The printer section 7 includes a print head (not shown) provided on the grip section 1a side inside a recording paper ejection opening 7a, and a platen roller (not shown) provided in an area opposite to the print head in the recording paper ejection opening 7a, as shown in FIG. 1. This printer section 7 is structured such that the print head prints information on recording paper fed between the print head and the platen roller (not shown).

Also, on the near side (lower end side in FIG. 1) of the device case 1, a card reader section 9 is provided as shown in FIG. 1 and FIG. 2. The card reader section 9 includes a card insertion opening 9a for reading information stored in a memory card such as a magnetic card, and information stored on the memory card is read by the memory card being inserted and slid into the card insertion opening 9a.

Figure 3:
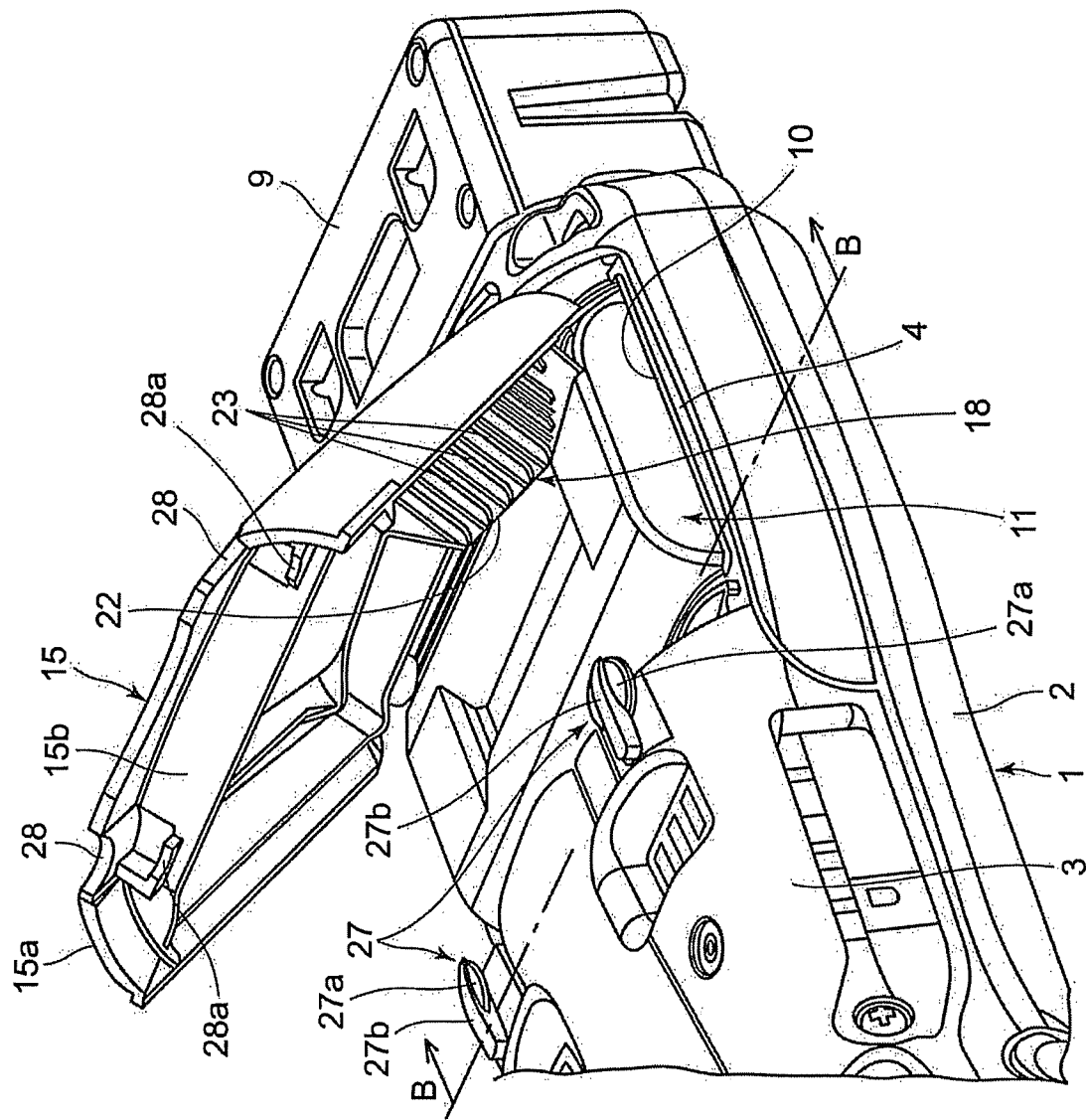
FIG. 3 is an enlarged perspective view of the main section of the mobile information terminal shown in FIG. 2, in which the battery cover is open.
Figure 4:
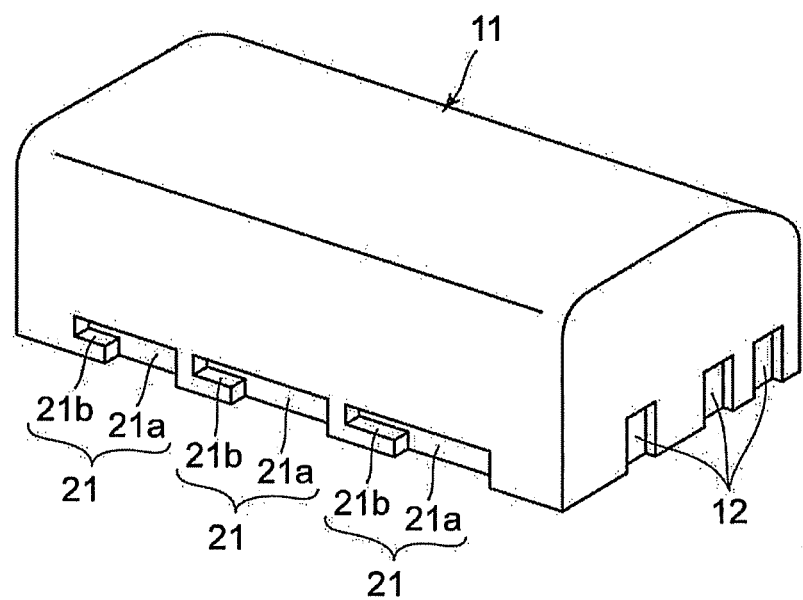
FIG. 4 is an enlarged perspective view of a battery pack that is stored in the battery storage section of the mobile information terminal shown in FIG. 3.

On the other hand, in the grip section 1a of the lower case 3 of the device case 1, a battery storage section 10 is provided which is open downward (upward in FIG. 3) from the lower case 3 and removably stores a battery pack 11, as shown in FIG. 3. The battery pack 11 is a rechargeable battery that supplies a sufficient current, or in other words, a large current to the printer section 7 when the printer section 7 prints information on recording paper. This battery pack 11 has a rectangular box-like shape as shown in FIG. 4, and battery electrodes 12 are provided to be exposed on a side surface (right side surface in FIG. 4) of the battery pack 11.

Figure 5:
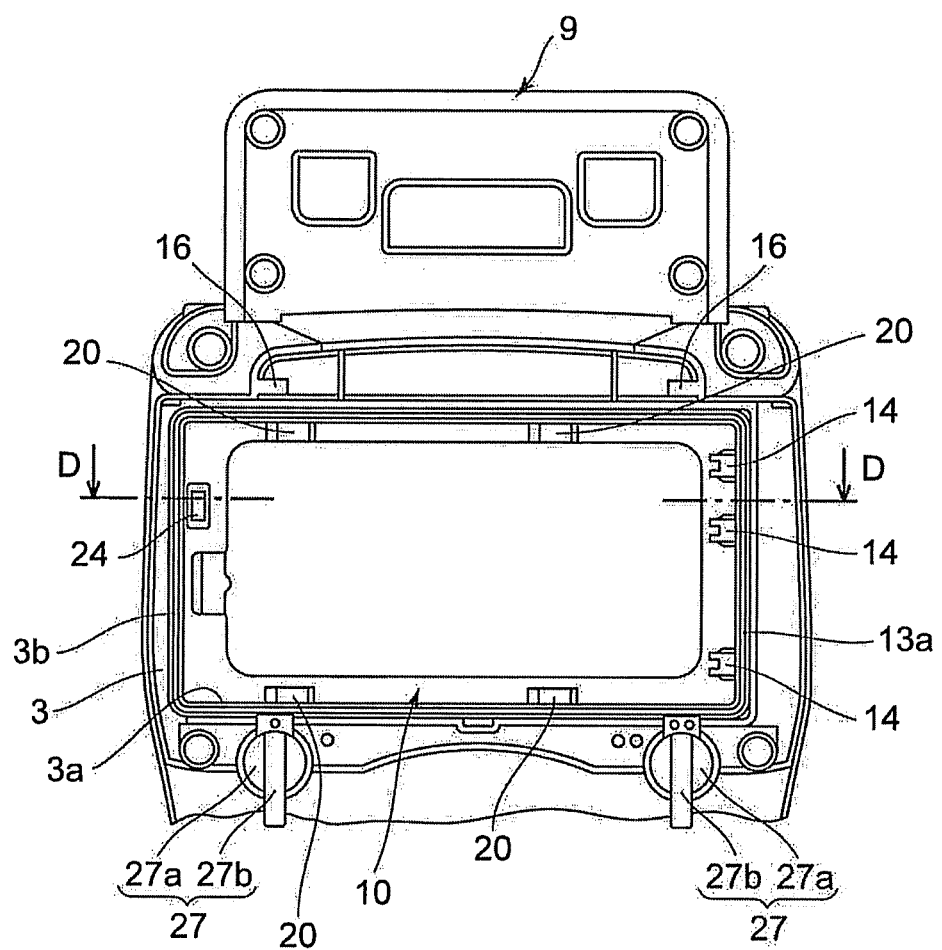
FIG. 5 is an enlarged planar view of the main section of the mobile information terminal in FIG. 3, in which the interior of the battery storage section is shown.
Figure 6:
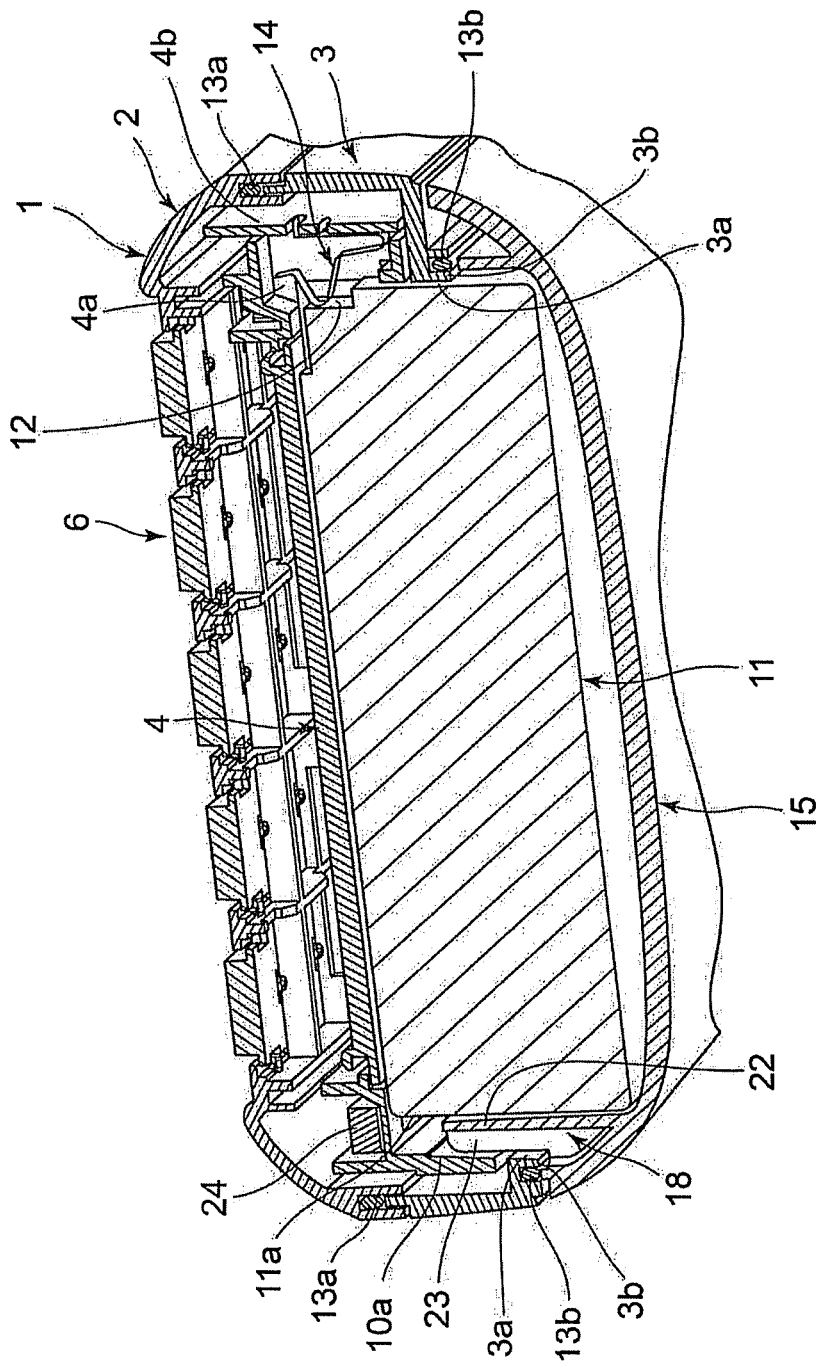
FIG. 6 is an enlarged cross-sectional view of the main section of the mobile information terminal taken along line A-A in FIG. 2.

The battery storage section 10 is provided in the inner case 4 inside the lower case 3, as shown in FIG. 5 and FIG. 6. In this instance, a battery opening section 3a where the battery pack 11 is inserted is provided in the lower case 3, and a waterproof gasket 13a is provided between the peripheral edge portion of the lower case 3 and the peripheral edge portion of the upper case 2, as shown in FIG. 6. The inner case 4 is used to attach a circuit board (not shown) on which various electrical components required for information processing are mounted.

The battery storage section 10 has a recessed shape and formed in an area corresponding to the battery opening section 3a of the lower case 3.

On the inner surface of the battery storage section 10, connection electrodes 14 are provided as shown in FIG. 5 and FIG. 6. These connection electrodes 14 are flat springs with which the battery electrodes 12 of the battery pack 11 come in contact, and are structured by metal plates partially bent into a U-shape. Specifically, the connection electrodes 14 are stored in a small chamber 4a provided on a side surface of the inner case 4, and attached to a connection substrate 4b adhered to the outer side of the small chamber 4a by double-faced adhesive tape (not shown). The connection electrodes 14 are structured such that the portions bent into a U-shape resiliently project towards the interior of the battery storage section 10.

Figure 7:
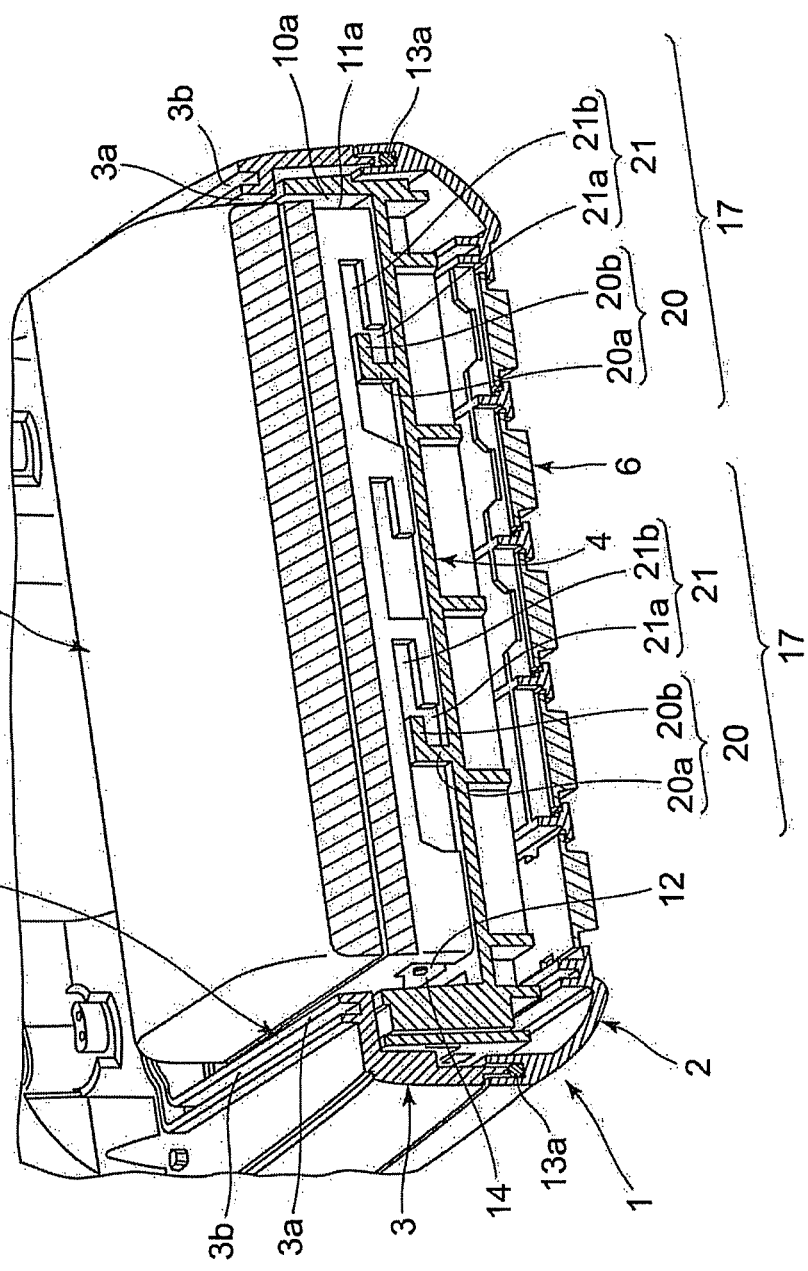
FIG. 7 is an enlarged perspective view of the main section of the mobile information terminal taken along line B-B in FIG. 3.

As a result, the battery storage section 10 is structured such that the battery pack 11 is inserted thereinto with the battery electrodes 12 of the battery pack 11 corresponding to the connection electrodes 14 of the battery storage section 10, as shown in FIG. 7. The inserted battery pack 11 is slid towards the connection electrodes 14, whereby the battery electrodes 12 of the battery pack 11 resiliently come in contact with the connection electrodes 14 projecting into the battery storage section 10, and electrically connected as shown in FIG. 7.

In addition, the battery storage section 10 is openably/closably covered by a battery cover 15, as shown in FIG. 3. The battery cover 15 is rotatably attached to a support shaft 16 provided on the edge portion of the battery opening section 3a in the lower case 3 along the sliding direction of the battery pack 11. This battery cover 15 includes a cover main body 15a having a curved shape which is continuous with the outer shape of the lower case 3 when the battery storage section 10 is covered, and a frame section 15b provided on the inner surface of the cover main body 15a, as shown in FIG. 6.

As a result, the battery cover 15 is structured such that, when the battery storage section 10 is covered, the frame section 15b comes in contact with and presses the waterproof gasket 13b provided in the edge portion of the battery opening section 3a in the lower case 3, as shown in FIG. 6 and FIG. 7. In this instance, a gasket groove 3b that stores the waterproof gasket 13b is provided in the edge portion of the battery opening section 3a in the lower case 3 continuously along the entire periphery of the battery opening section 3a.

Also, this battery storage structure includes locking members 17 that engageably/disengageably lock the battery pack 11 inserted into the battery storage section 10 so that the battery pack 11 is held securely within the battery storage section 10, and a guide pressing section 18 that presses the battery pack 11 towards the connection electrodes 14 once inserted into the battery storage section 10 between inner surface parts positioned on opposite sides of the connection electrode of the battery storage section and the battery pack 11 opposing side, as shown in FIG. 3 to FIG. 7.

The locking members 17 engageably/disengageably lock the battery pack 11 within the battery storage section 10 by sliding the battery pack 11 while being inserted into the battery storage section 10 with the battery electrodes 12 of the battery pack facing the connection electrodes 14 within the battery storage section 10.

Specifically, the locking members 17 include locking projected sections 20 that are provided on the inner surface of the battery storage section 10 along the sliding direction of the battery pack 11 and project towards the side opposite to the connection electrodes 14, and engaging grooves 21 that are provided on both side surfaces of the battery pack 11 along the sliding direction and engage with the locking projected sections 20 when the battery pack 11 is inserted into the battery storage section 10 and slid towards the connection electrodes 14, as shown in FIG. 7.

The locking projected sections 20 are reverse L-shaped hook sections provided on the inner surface of the battery storage section 10 along the sliding direction of the battery pack 11. Each of the locking projected sections 20 include a support piece 20a that is provided along the up and down direction and a projecting piece 20b that is provided on the end portion of the support piece 20a and projects towards the side opposite to the connection electrodes 14, as shown in FIG. 5 and FIG. 7.

The engaging grooves 21 are grooves that are provided on each side surface of the battery pack 11 along the sliding direction, and the locking projected sections 20 engage therewith. These engaging grooves 21 include insertion groove sections 21a into which the locking projected sections 20 are inserted when the battery pack 11 is inserted into the battery storage section 10, and engaging groove sections 21b into which the projecting pieces 20b of the locking projected sections 20 are inserted to be engaged when the battery pack 11 is slid towards the connection electrodes 14 of the battery storage section 10, as shown in FIG. 4 and FIG. 7.

The engaging grooves 21 are provided in a plurality of areas on each side surface of the battery pack 11, in each of which the insertion groove section 21a and the engaging groove section 21b are continuous, as shown in FIG. 4 and FIG. 7. The insertion groove sections 21a of the engaging grooves 21 are formed such that their lengths in the sliding direction of the battery pack 11 are sufficiently longer than, for example, about twice the length, as the lengths of the projecting pieces 20b of the locking projected sections 20, as shown in FIG. 7.

The engaging groove sections 21b are formed such that their lengths in the sliding direction of the battery pack 11 are slightly longer than the lengths of the projecting pieces 20b of the locking projected sections 20, as shown in FIG. 7. Accordingly, when the battery pack 11 being inserted into the battery storage section 10 is slid, the projecting pieces 20b of the locking projected sections 20 are inserted into the engaging groove sections 21b of the engaging grooves 21 and locked.

As a result, when the battery pack 11 is stored in the battery storage section 10 and the projecting pieces 20b of the locking projected sections 20 are locked by the engaging groove sections 21b of the engaging grooves 21, the position of the battery pack 11 in the insertion and removal directions (up and down direction in FIG. 7) within the battery storage section 10 is restricted as shown in FIG. 7, whereby the battery pack 11 will not fall out of the battery storage section 10.

Figure 8:
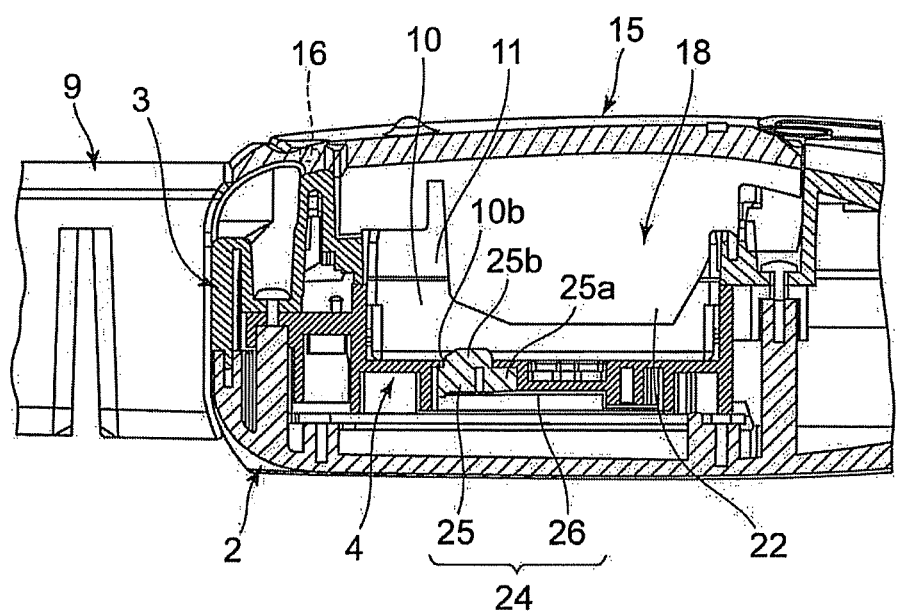
FIG. 8 is an enlarged cross-sectional view of the main section of the mobile information terminal taken along line C-C in FIG. 2.

Also, the guide pressing section 18 is provided in the end portion of the battery cover 15 on the side opposite to the connection electrodes 14 of the battery storage section 10, and project into the battery storage section 10, as shown in FIG. 3, FIG. 6, and FIG. 8. This guide pressing section 18 includes an insertion pressing surface section 22 that gradually presses the battery pack 11 towards the connection electrodes 14 by being gradually inserted between a portion of the inner surface 10a of the battery storage section 10 on the side opposite to the connection electrodes 14 and the side surface 11a of the battery pack 11 facing this portion, when the battery cover 15 covers the battery storage section 10.

Figure 10A:
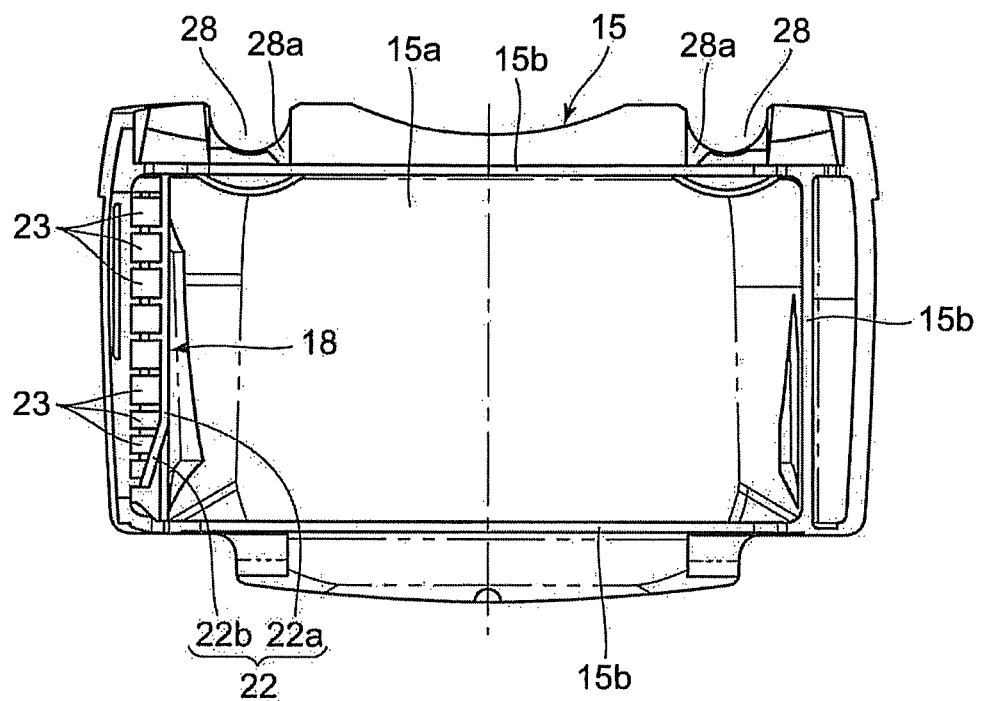
Figure 10B:
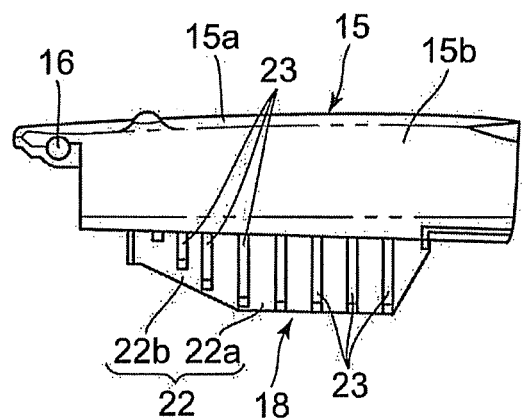

The insertion pressing surface section 22 has a curved-surface shape that is a combination of an insertion guide surface section 22a and a pressing surface section 22b, as shown in FIG. 10A and FIG. 10B. The insertion guide surface section 22a is gradually inserted between a portion of the inner surface 10a of the battery storage section 10 on the side opposite to the connection electrodes 14 and the side surface 11a of the battery pack 11 facing this inner surface 10a, and the pressing surface section 22b gradually presses the battery pack 11 towards the connection electrodes 14, when the battery cover 15 covers the battery storage section 10.

In this instance, the insertion guide surface section 22a of the insertion pressing surface section 22 is formed into a curved surface having a sloped-shape so that its tip portion gradually moves downward when rotating around the support shaft 16 of the battery cover 15, as shown in FIG. 10B. As a result, when the battery cover 15 rotates around the support shaft 16 to cover the battery storage section 10, the tip portion of the insertion guide surface section 22a is gradually inserted into the battery storage section 10.

The pressing surface section 22b of the insertion pressing surface section 22 is formed such that its tip portion is gradually inclined from the inner surface 10a of the battery storage section 10 on the side opposite to the connection electrodes 14 towards the side surface 11a of the battery pack 11 facing this inner surface 10a when the battery cover 15 rotates around the support shaft 16 and covers the battery storage section 10, as shown in FIG. 10A.

As a result, the insertion pressing surface section 22, which has a curved-surface shape formed by a combination of the insertion guide surface section 22a and the pressing surface section 22b, is structured to press the battery pack 11 towards the connection electrodes 14 by being gradually inserted between a portion of the inner surface 10a of the battery storage section 10 on the side opposite to the connection electrodes 14 and the side surface 11a of the battery pack 11 facing this portion when the battery cover 15 rotates around the support shaft 16 to cover the battery storage section 10 where the battery pack 11 is stored, as shown in FIG. 10A and FIG. 10B.

Also, the guide pressing section 18 has a plate shape and formed in the end portion of the battery cover 15 along a direction perpendicular to the sliding direction of the battery pack 11, as shown in FIG. 10A and FIG. 10B. Accordingly, reinforcement ribs 23 having a lattice shape are provided on the outer surface of the guide pressing section 18 which is the opposite side of the inner surface that comes in contact with the battery pack 11.

As a result, the strength of the guide pressing section 18 having a plate shape is reinforced with the reinforcement ribs 23, as shown in FIG. 10A and FIG. 10B. In this instance, the reinforcement ribs 23 are formed such that the thickness of the tip portion side (lower end side in FIG. 10B) becomes gradually thinner. Among all the reinforcement ribs 23, reinforcement ribs 23 in the area of the pressing surface section 22b are formed such that their thickness becomes thinner according to the slope of the pressing surface section 22b.

Figure 9:
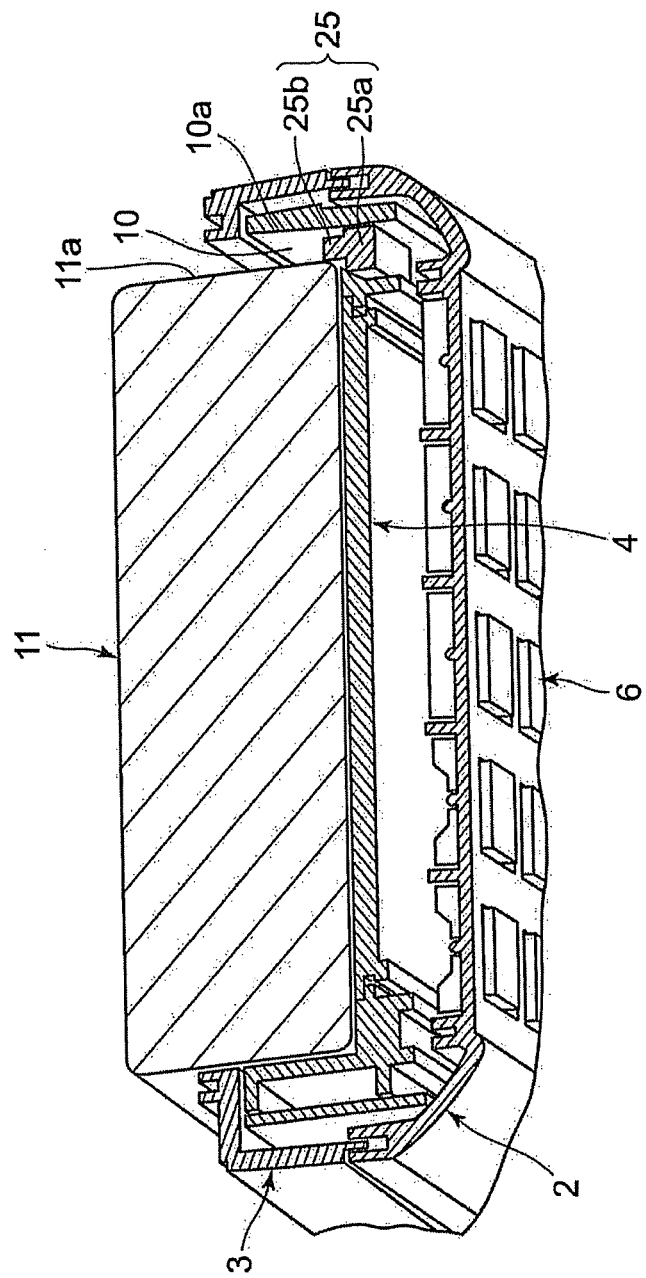
FIG. 9 is an enlarged perspective view of the main section of the battery storage section of the mobile information terminal taken along line D-D in FIG. 5.

Also, in the battery storage section 10, a position restricting member 24 is provided as shown in FIG. 3, FIG. 8, and FIG. 9. The position restricting member 24 retractably protrudes into the battery storage section 10 and restricts the position of the battery pack 11 in the sliding direction, when the battery pack 11 inserted into the battery storage section 10 is slid into place and the battery electrodes 12 come into contact with the connection electrodes 14.

Specifically, the position restricting member 24 includes a position restricting button 25 arranged under a portion of the bottom of the battery storage section 10 on the side opposite to the connection electrodes 14, and a flat spring 26 that retractably forces the position restricting button 25 outward into the battery storage section 10, as shown in FIG. 8 and FIG. 9. In this instance, the position restricting button 25 includes a button main body 25a positioned under the battery storage section 10 in a manner to be movable in the up and down direction, and a lock section 25b that is provided on the button main body 25a and retractably inserted into an insertion hole 10b in the bottom portion of the battery storage section 10.

One end portion of the flat spring 26 resiliently comes in contact with the underside of the button main body 25a of the position restricting button 25 and the other end portion is fixed to the underside of the inner case 4, as shown in FIG. 8 and FIG. 9. In this state, the flat spring 26 resiliently presses the button main body 25a upward and thereby presses the lock section 25a outward into the battery storage section 10. As a result, the position restricting member 24 is structured such that, when the battery pack 11 is inserted into the battery storage section 10, the lock section 25b of the position restricting button 25 is pressed downward from within the battery storage section 10 by the battery pack 11, against the spring force of the flat spring 26.

When the battery pack 11 inserted into the battery storage section 10 is slid towards the connection electrodes 14 with the lock section 25b of the position restricting button 25 being pressed by the battery pack 11, the button main body 25a of the position restricting button 25 is pressed upward by the spring force of the flat spring 26 and the lock section 25b is pressed outward into the battery storage section 10, as shown in FIG. 8 and FIG. 9. As a result, the side surface 11a of the battery pack 11, or in other words, a portion of the side surface 11a of the battery pack 11 on the side opposite to the battery electrodes 12 comes in contact with the lock section 25b that is being pressed outward, whereby the position of the battery pack 11 in the sliding direction is restricted.

Also, on the lower case 3, a pair of cover locking members 27 are provided that engageably/disengageably lock the battery cover 15, as shown in FIG. 2. The cover locking members 27 include lock sections 27a that are rotatably provided on the sides of the edge of the battery opening section 3a in the lower case 3 and positioned on the side opposite to the support shaft 16 of the battery cover 15, and operating levers 27b that are provided on the lock sections 27a and rotate the lock sections 27a.

In this instance, each of the lock sections 27a is rotatably arranged such that substantially half thereof is positioned within a semicircular lock groove 28 provided in the edge of the battery cover 15 on the side opposite to the supporting shaft 16, and engageably/disengageably lock a locking flange section 28a provided within the lock groove 28. When the lock sections 27a are rotated by the operation of the operating levers 27b and released from within the lock grooves 28, the locking flange sections 28a within the lock grooves 28 are released from being locked by the lock sections 27a.

As a result, in the structure of the cover locking members 27, when the battery cover 15 covers the battery storage section 10 and is closed as shown in FIG. 2, the lock sections 27a correspond to the lock grooves 28 of the battery cover 15. Then, when the operating levers 27b are operated and the lock sections 27a are rotated in this state, the lock sections 27a are partially arranged within the lock grooves 28 and press the locking flange sections 28a within the lock groove 28 towards the lower case 3. As a result, the battery cover 15 is locked.

Next, effects of this battery storage structure of the mobile information terminal will be described.

When the battery pack 11 is to be placed in the battery storage section 10, first, the battery cover 15 is rotated and the battery storage section 10 is opened. In this operation, each operating lever 27b of the pair of cover locking members 27 is operated, whereby the lock sections 27a are detached from the locking flange sections 28a within the lock grooves 28, and the battery cover 15 is released from being locked by the pair of cover locking members 27. Then, when the battery cover 15 is rotated around the support shaft 16 of the battery cover 15, the battery storage section 10 is opened.

In this state, the battery pack 11 is inserted into the battery storage section 10. In this operation, the battery pack 11 is placed such that the battery electrodes 12 correspond to the connection electrodes 14 of the battery storage section 10, and then inserted into the battery storage section 10 from the battery opening section 3a in the lower case 3. Accordingly, the locking projected sections 20 provided on the inner surface of the battery storage section 10 are relatively moved and inserted into the insertion groove sections 21a of the engaging grooves 21 provided on the side surfaces of the battery pack 11 along the sliding direction. In addition, the lock section 25b of the position restricting button 25 of the position restricting member 24 protruding from the bottom portion of the battery storage section 10 is pressed downward by the battery pack 11 against the spring force of the flat spring 26.

Then, the battery pack 11 is slid into place and the battery electrodes 12 of the battery pack 11 are pressed against the connection electrodes 14 within the battery storage section 10. In this operation, the projecting pieces 20b of the locking projected sections 20 of the battery storage section 10 are relatively moved from within the insertion groove sections 21a of the engaging grooves 21 of the battery pack 11 and inserted into the engaging groove sections 21b of the engaging grooves 21, along with the sliding of the battery pack 11. As a result, the battery pack 11 is restricted from moving in the detaching direction from the battery storage section 10, or in other words, the position of the battery pack 11 in the up and down direction within the battery storage section 10 is restricted.

Also, in this operation, the side surface 11a of the battery pack 11 moves away from the lock section 25b of the position restricting button 25 of the position restricting member 24 by the sliding of the battery pack 11. Therefore, the position restricting button 25 is pushed upward by the spring force of the flat spring 26, and the lock section 25b thereof protrudes into the battery storage section 10 and comes in contact with the side surface 11a of the battery pack 11, whereby the battery pack 11 within the battery storage section 10 is restricted from moving in the sliding direction.

As a result, the movement of the battery pack 11 in the detaching direction (up and down direction) and the sliding direction (left and right direction) in relation to the battery storage section 10 is restricted, and the battery pack 11 is temporarily fixed in the battery storage section 10. In this state, the battery cover 15 is closed and thereby covers the battery storage section 10. In this operation, when the battery cover 15 is rotated around the support shaft 16, the guide pressing section 18 provided thereon presses the battery pack 11 towards the connection electrodes 14 by being inserted between a portion of the inner surface 10a of the battery storage section 10 on the side opposite to the connection electrodes 14 and the side surface 11a of the battery pack 11 facing this portion.

That is, when the battery cover 15 is rotated to cover the battery storage section 10, the insertion guide surface section 22a of the insertion pressing surface section 22 of the guide pressing section 18 is gradually inserted between the inner surface 10a of the battery storage section 10 and the side surface 11a of the battery pack 11 facing this inner surface 10a, and the pressing surface section 22b of the insertion pressing surface section 22 gradually presses the battery pack 11 towards the connection electrodes 14 of the battery storage section 10. As a result, the battery electrodes 12 of the battery pack 11 are pressed against the connection electrodes 14 of the battery storage section 10 and electrically connected when the battery cover 15 is closed and the battery storage section 10 is covered thereby.

Then, the closed battery cover 15 covering the battery storage section 10 is locked by the cover locking members 27. In this operation, when the lock sections 27a arranged corresponding to the lock grooves 28 of the battery cover 15 are rotated by the operation levers 27b being operated, they are partially placed within the lock grooves 28 and press the locking flange sections 28a towards the lower case 3. As a result, the battery cover 15 is locked to the lower case 3.

On the other hand, when the battery pack 11 is to be removed from the battery storage section 10, first, the battery cover 15 is released from being locked by the cover locking members 27, and then the battery cover 15 is rotated and opened. In this operation, the guide pressing section 18 of the battery cover 15 is pulled out from between the inner surface 10a of the battery storage section 10 and the side surface 11a of the battery pack 11 facing this inner surface 10a, and the battery pack 11 is released from being pressed against the connection electrodes 14 of the battery storage section 10.

In this state, since the lock section 25b of the position restricting button 25 of the position restricting member 24 in the bottom portion of the battery storage section 10 has been pressed outward into the battery storage section 10 by the spring force of the flat spring 16, the battery pack 11 within the battery storage section 11 has been restricted from moving in the sliding direction, and thereby being temporarily fixed within the battery storage section 10. Therefore, even if the battery cover 15 is inadvertently opened, the battery pack 11 will not fall out of the battery storage section 10.

When the lock section 25b of the position restricting button 25 is pressed downward against the spring force of the flat spring 26, the restriction on the movement of the battery pack 11 in the sliding direction by the lock section 25b of the position restricting button 25 is released. In this state, when the battery pack 11 is slid in the direction away from the connection electrodes 14, the projecting pieces 20b of the locking projected sections 20 provided on the inner surface of the battery storage section 10 are relatively moved within the engaging groove sections 21b of the engaging grooves 21 provided on the side surfaces of the battery pack 11, and then positioned within the insertion groove sections 21a of the engaging grooves 21. As a result, the battery pack 11 is released from being locked by the locking member 17, and therefore can be removed from the battery storage section 10.

As described above, this battery storage structure of the mobile information terminal includes the locking member 17 and the guide pressing section 18. The locking member 17 engageably/disengageably locks the battery pack 11 into the battery storage section 10 by the battery pack 11 inserted into the battery storage section 10 being slid with its battery electrodes 12 facing the connection electrodes 14 within the battery storage section 10. The guide pressing section 18, which is provided on the battery cover 15, presses the battery pack 11 towards the connection electrodes 14 by being inserted between a portion of the inner surface 10a of the battery storage section 10 on the side opposite to the connection electrodes 14 and the side surface 11a of the battery pack 11 facing this portion when the battery cover 15 covers the battery storage section 10 storing the battery pack 11. Therefore, the battery pack 11 can be securely and favorably stored, and the battery electrodes 12 of the battery pack 11 and the connection electrodes 14 of the battery storage section 10 can be favorably and unfailingly connected.

That is, in this battery storage structure, when the battery pack 11 is inserted into the battery storage section 10 and slid with its battery electrodes 12 facing the connection electrodes 14 within the battery storage section 10, it is locked into the battery storage section 10 by the locking member 17. Therefore, the battery pack 11 can be securely and favorably stored within the battery storage section 10, and thereby prevented from falling out of the battery storage section 10, and protected from being damaged.

In addition, the guide pressing section 18 provided on the battery cover 15 presses the battery pack 11 towards the connection electrodes 14 by being inserted between a portion of the inner surface 10a of the battery storage section 10 on the side opposite to the connection electrodes 14 and the side surface 11a of the battery pack 11 facing this portion when the battery cover 15 is covered. Therefore, the connection electrodes 14 of the battery storage section 10 and the battery electrodes 12 of the battery pack 11 can be unfailingly and favorably connected. As a result of this structure, even if the mobile information terminal receives impact and vibration from being dropped, the connection electrodes 14 of the battery storage section 10 and the battery electrodes 12 of the battery pack 11 are not disconnected. Therefore, the reliability of the connection therebetween is ensured, and sufficient current is surely supplied during printing by the printer section 7.

In this instance, the locking member 17 includes the locking projected sections 20 that are provided on the inner surface of the battery storage section 10 along the sliding direction of the battery pack 11 and project towards the side opposite to the connection electrodes 14, and the engaging grooves 21 that are provided on the side surfaces of the battery pack 11 along the sliding direction and engages with the locking projected sections 20 when the battery pack 11 is inserted into the battery storage section 10 and slid towards the connection electrodes 14. Therefore, the position of the battery pack 11 within the battery storage section 10 can be securely and favorably restricted so that the battery pack 11 will not fall out of the battery storage section 10, by a simple operation to insert and slide the battery pack 11 into the battery storage section 10.

That is, the locking projected sections 20 of the locking member 17 are reverse L-shaped hook sections provided on the inner surface of the battery storage section 10 along the sliding direction of the battery pack 11, and include the support pieces 20a that are provided along the up and down direction and the projecting pieces 20b that are provided on the end portions of the support pieces 20a and project towards the side opposite to the connection electrodes 14. In addition, the engaging grooves 21 include the insertion groove sections 21a where the locking projected sections 20 are inserted and the engaging groove sections 21b where the projecting pieces 20b of the locking projected sections 20 are inserted. As a result, the position of the battery pack 11 within the battery storage section 10 can be securely and favorably restricted.

In this instance, when the battery pack 11 is inserted into the battery storage section 10, the locking projected sections 20 are relatively inserted into the insertion groove sections 21a of the engaging grooves 21. Then, when the battery pack 11 is slid towards the connection electrodes 14 in this state, the projecting pieces 20b are relatively inserted into the engaging groove sections 21b of the engaging grooves 21 and locked. Therefore, the position of the battery pack 11 in the up and down direction that is the detaching direction can be securely restricted. As a result, the position of the battery pack 11 within the battery storage section 10 can be securely restricted so that the battery pack 11 will not fall out of the battery storage section 10. By this structural feature as well, the reliability of the connection between the connection electrodes 14 of the battery storage section 10 and the battery electrodes 12 of the battery pack 11 is ensured.

Also, in this battery storage structure, the battery case 15 is rotatably attached to the support shaft 16 provided in a portion of the device case 1 corresponding to the edge portion of the battery storage section 10 along the sliding direction of the battery pack 11. Therefore, the battery storage section 10 can be covered by a simple operation to rotate the battery cover 15 relative to the device case 1. In addition, since the battery cover 15 is a cover attached to the device case 1, the loss of the battery cover 15 is prevented, which makes the mobile information terminal convenient to use.

Moreover, the guide pressing section 18 of this battery storage structure includes the insertion pressing surface section 22 which gradually presses the battery pack 11 towards the connection electrodes 14 by being gradually inserted between a portion of the inner surface 10a of the battery storage section 10 on the side opposite to the connection electrodes 14 and the side surface 11a of the battery pack 11 facing this portion when the battery cover 15 covers the battery storage section 10. Accordingly, by the insertion pressing surface section 22, the guide pressing section 18 can be securely inserted between the inner surface 10a of the battery storage section 10 and the side surface 11a of the battery pack 11 facing this inner surface 10a, and the battery pack 11 can be unfailingly and favorably pressed towards the connection electrodes 14, when the battery cover 15 covers the battery storage section 10.

In this instance, the insertion pressing surface section 22 has a curved-surface shape formed by a combination of the insertion guide surface section 22a and the pressing surface section 22b. The insertion guide surface section 22a is gradually inserted between a portion of the inner surface 10a of the battery storage section 10 on the side opposite to the connection electrodes 14 and the side surface 11a of the battery pack 11 facing this portion, and the pressing surface section 22b gradually presses the battery pack 11 towards the connection electrodes 14, when the battery cover 15 covers the battery storage section 10. As a result of this structure, the guide pressing section 18 can be unfailingly inserted between the inner surface 10a of the battery storage section 10 and the side surface 11a of the battery pack 11 facing this inner surface 10a, by the insertion guide surface section 22a. In addition, the guide pressing section 18 can be pressed against the battery pack 11, and the battery pack 11 can be securely and favorably pressed towards the connection electrodes 14, by the pressing surface section 22b.

Furthermore, in this battery storage structure, the reinforcement ribs 23 are provided on the outer surface of the guide pressing section 18 which is the opposite side of the inner surface that comes in contact with the battery pack 11. Therefore, although the guide pressing section 18 is formed thin to facilitate the insertion of the guide pressing section 18 between the inner surface 10a of the battery storage section 10 and the side surface 11a of the battery pack 11 facing this inner surface 10a, the strength of the guide pressing section 18 is ensured by the reinforcement ribs 23. As a result, the battery pack 11 can be securely and favorably pressed towards the connection electrodes 14 by the guide pressing section 18.

In this instance, the reinforcement ribs 23 are formed such that the thickness of the tip portion side becomes gradually thinner. Among all the reinforcement ribs 23, reinforcement ribs 23 in the area of the pressing surface section 22b are formed such that their thickness becomes thinner according to the slope of the pressing surface section 22b. Therefore, although the guide pressing section 18 is provided with the reinforcement ribs 23, it can be securely and favorably inserted between the inner surface 10a of the battery storage section 10 and the side surface 11a of the battery pack 11 facing this inner surface 10a. As a result, the battery pack 11 can be unfailingly and favorably pressed towards the connection electrodes 14.

Still further, this battery storage structure includes the position restricting member 24 that retractably protrudes into the battery storage section 10 and restricts the position of the battery pack 11 in the sliding direction when the battery pack 11 inserted into the battery storage section 10 is slid and comes in contact with the connection electrodes 14. Therefore, the battery pack 11 can be temporarily fixed in the battery storage section 10 by the position restricting member 24 when the battery pack 11 is inserted into the battery storage section 10 and comes in contact with the connection electrodes 14. As a result, even when the battery cover 15 is open, the battery pack 11 can be prevented from falling out of the battery storage section 10.

That is, the position restricting member 24 includes the position restricting button 25 arranged under a portion of the bottom of the battery storage section 10 on the side opposite to the connection electrodes 14, and the flat spring 26 that retractably forces the position restricting button 25 outward into the battery storage section 10. When the lock section 25b of the position restricting button 25 is pressed by the battery pack 11 being inserted into the battery storage section 10, the lock section 25b is pressed outward from within the battery storage section 10. As a result, the battery pack 11 can be slid towards the connection electrodes 14.

Also, when the battery pack 11 is slid towards the connection electrodes 14 with the lock section 25b being pressed outward from within the battery storage section 10, the button main body 25a of the position restricting button 25 is pressed by the spring force of the flat spring 26, and the lock section 25b is pressed outward into the battery storage section 10. As a result, the position of the side surface 11a of the battery pack 11 on the side opposite to the battery electrodes 12 is restricted by this outwardly pressed lock section 25b. As a result of this configuration, the position of the battery pack 11 in the sliding direction can be securely and favorably restricted.

Thus, the battery pack 11 can be unfailingly prevented from falling out of the battery storage section 10 even when the battery cover 15 is inadvertently opened. Also, when the battery pack 11 is to be removed from the battery storage section 10, the position restricting member 24 allows the battery pack 11 to be slid in the direction away from the connection electrodes 14 by the lock section 25b being pressed downward against the spring force of the flat spring 26 and the restriction on the position of the battery pack 11 being released. Then, the battery pack 11 is pressed upward by the lock section 25b being pressed upward by the spring force of the flat spring 26. As a result, the battery pack 11 can be easily removed from the battery storage section 10.

As described above, in this mobile information terminal, when the battery pack 11 is inserted into the battery storage section 10 and slid with its battery electrodes 12 facing the connection electrodes 14 within the battery storage section 10, it is locked into the battery storage section 10 by the locking member 17. Therefore, the battery pack 11 can be securely and favorably stored within the battery storage section 10.

Also, in this mobile information terminal, the guide pressing section 18 presses the battery pack 11 towards the connection electrodes 14 by being inserted between a portion of the inner surface 10a of the battery storage section 10 on the side opposite to the connection electrodes 14 and the side surface 11a of the battery pack 11 facing this portion when the battery cover 15 covers the battery storage section 10. Therefore, the connection electrodes 14 of the battery storage section 10 and the battery electrodes 12 of the battery pack 11 can be unfailingly and favorably connected, which makes the mobile information terminal user-friendly.

In the above-described embodiment, the present invention has been applied to a mobile information terminal. However, the present invention is not necessarily required to be applied to a mobile information terminal, and can be applied to electronic devices such as mobile phones and mobile personal computers.

While the present invention has been described with reference to the preferred embodiments, it is intended that the invention be not limited by any of the details of the description therein but includes all the embodiments which fall within the scope of the appended claims.

What is claimed is:

1. An electronic device comprising: a battery cover which is rotatably attached to a support shaft and covers a battery storage section where a battery pack is stored; and a guide pressing section which is provided on the battery cover and presses a battery electrode of the battery pack towards a connection electrode provided within the battery storage section once inserted between an inner surface of the battery storage section and a side surface of the battery pack stored in the battery storage section with the battery cover rotating around the support shaft and covering the battery storage section, wherein the guide pressing section has an insertion pressing surface section which is deeply inserted between the inner surface of the battery storage section and the side surface of the battery pack as the battery cover rotates, and by which a distance of the battery pack being pressed becomes large as the battery cover rotates, and wherein the insertion pressing surface section has a part projecting towards the inner surface of the battery storage section and a part pressing the side surface of the battery pack, and the insertion pressing surface section has a curved-surface shape that is a combination of an insertion guide surface section which is deeply inserted between the inner surface of the battery storage section and the side surface of the battery pack as the battery cover rotates, and a pressing surface section by which a distance of the battery pack being pressed becomes large as the battery cover rotates; wherein the guide pressing section has a reinforcement rib provided on a surface thereof located on a side opposite to a surface that comes in contact with the battery pack.

2. The electronic device according to claim 1, wherein, when the battery cover rotates around the support shaft, the insertion guide surface section is formed into a curved surface having a sloped-shape so that its tip portion gradually moves downward as the battery cover rotates.

3. The electronic device according to claim 1, further comprising:
a locking member which slides the battery pack stored in the battery storage section towards the connection electrode, and engagably/disengagably locks the battery pack within the battery storage section.

4. The electronic device according to claim 3, wherein the locking member comprises: a locking projected section which is provided on an inner surface of the battery storage section along a sliding direction of the battery pack and projects towards the connection electrode opposing side, and an engaging groove which is provided on a side surface in line with the sliding direction of the battery pack that engages with the locking projected section, when the battery pack is stored in the battery storage section and slid towards the connection electrode.

5. The electronic device according to claim 1, further comprising: a position restricting member which retractably protrudes into the battery storage section and restricts position of the battery pack in a sliding direction, when the battery pack stored in the battery storage section is slid and comes in contact with the connection electrode.

* * * * *